United States Patent [19]

Chao

[11] Patent Number: 5,309,009
[45] Date of Patent: May 3, 1994

[54] INTEGRATED ELECTRICALLY ADJUSTABLE ANALOG TRANSISTOR DEVICE

[76] Inventor: Robert L. Chao, 14555 Harvard Ct., Los Altos, Calif. 94022

[21] Appl. No.: 944,546

[22] Filed: Sep. 14, 1992

[51] Int. Cl.$^5$ .......................................... H01L 27/02
[52] U.S. Cl. ................... 257/318; 257/214; 257/314
[58] Field of Search ............ 257/314, 315, 316, 318, 257/214

[56] References Cited

U.S. PATENT DOCUMENTS

| | | | |
|---|---|---|---|
| 4,649,520 | 3/1987 | Eitan | 257/318 |
| 4,924,278 | 5/1990 | Logie | 257/318 |
| 5,089,433 | 2/1992 | Anand et al. | 257/318 |
| 5,198,691 | 3/1993 | Tarng | 257/318 |
| 5,216,269 | 6/1993 | Middelhoek et al. | 257/318 |

FOREIGN PATENT DOCUMENTS

| | | | |
|---|---|---|---|
| 0133667 | 3/1985 | European Pat. Off. | 257/318 |
| 0018367 | 1/1982 | Japan | 257/318 |
| 0078179 | 5/1982 | Japan | 257/318 |
| 0155967 | 9/1984 | Japan | 257/318 |

Primary Examiner—Rolf Hille
Assistant Examiner—David Ostrowski
Attorney, Agent, or Firm—Harry M. Weiss

[57] ABSTRACT

An analog MOS transistor device allows the user to set the threshold characteristics of the device. This transistor device is fabricated using conventional CMOS fabrication materials and methods. An insulated gate spans across a source junction, a drain junction, and a control junction. This gate can be charged or discharged to a desired voltage level by injecting or removing charge at the insulated gate. The insulated gate has no conductor connection, and is only capacitively coupled to the source junction, drain junction and control junction. The user sets the voltage on the insulated gate, then varies the voltage impressed on the control junction as the application requires. The user can set the channel conductivity characteristics of the device by setting the charge level on the insulated gate, and by varying the voltage on the control junction, both of which may be dynamically adjusted in-circuit.

2 Claims, 2 Drawing Sheets

INTEGRATED ELECTRICALLY ADJUSTABLE ANALOG TRANSISTOR DEVICE

FIELD OF THE INVENTION

This invention generally relates to semiconductor devices and methods, and, more specifically, relates to an integrated electrically adjustable analog transistor device and method which has a control terminal which controls the transistor channel characteristics through setting the threshold voltage of the transistor according to the charge level on an insulated gate capacitively coupled to the control terminal. The charge level of the insulated gate can be set by the user by injecting current into the drain junction of the transistor, thereby charging the insulated gate. Changing the charge level of the insulated gate changes the threshold voltage required on the control terminal to allow a given amount of current to flow between source and drain junctions.

DESCRIPTION OF THE PRIOR ART

A number of applications in the analog integrated circuit field could benefit from an analog Metal Oxide Semiconductor (MOS) device with a threshold voltage that is electrically adjustable and settable by the user. However, construction and fabrication of such a device with the stability and resolution sufficient for most modern applications have not been previously possible.

Therefore, there existed a need to provide an electrically adjustable MOS transistor device with good stability and resolution, which is compatible with conventional MOS fabrication and processing techniques. In order to have good stability and resolution, these analog MOS devices must be constructed with high quality thin insulating layers that exhibit very low leakage currents, permitting little or no charge loss over extended periods of time. Furthermore, these analog threshold voltage adjustable MOS transistor devices must be compatible in method of construction and fabrication with other MOS transistor devices such that a useful analog circuit can be designed and fabricated into one integrated circuit silicon substrate.

SUMMARY OF THE INVENTION

It is an object of the present invention to provide a MOS transistor device which is compatible with a conventional Complementary MOS (CMOS) process which has an electrically adjustable threshold set by injecting current into the drain junction (thereby changing the charge on an insulated gate), and adjusted by an external analog voltage applied to a control terminal.

It is another object of the present invention to provide an adjustable MOS transistor device which utilizes the same insulating layer structure and the same polycrystalline silicon layer structure as that required to fabricate transistor devices using a conventional CMOS fabrication process.

It is a further object of this invention to provide an adjustable MOS transistor device which has a stable insulated conductor layer that maintains charge stored on the conductor layer over the useful life of a given application.

According to the present invention, an adjustable MOS analog transistor device is provided. This invention comprises a source junction and a drain junction each having conductor connections. An insulated gate region spanning across the source and drain junctions is provided but has no conductor connection. This gate region extends beyond the source and drain junctions to a control junction having a conductor connection. This control junction, like the source and drain junctions, is capacitively coupled to the insulated gate. The insulated gate maintains a charge level over the useful life of the device. This charge level, in conjunction with the voltage level on the control junction, determines the threshold characteristics of the device. A user can increase the charge level on the insulated gate by injecting current into the drain junction, a small portion of which charges the insulated gate to a different voltage potential. Since the gate is insulated, the charge remains at a constant level indefinitely, with the voltage on the control junction controlling the transistor channel characteristics as is the case with conventional CMOS circuits. However, the user may change the threshold characteristics of the device of the present invention by injecting current into the drain junction at predetermined drain junction and control terminal voltage potentials, which increases the charge on the insulated gate region. Once the user sets the charge level of the insulated gate, the charge level remains constant, and the device appears to be functionally equivalent to a conventional MOS device with the exception of a threshold voltage that varies according to the charge level of the insulated gate selected by the user.

The foregoing and other objects, features and advantages will be apparent from the following description of the preferred embodiment of the invention as illustrated in the accompanying drawings.

DESCRIPTION OF THE PREFERRED EMBODIMENT

Figure 1:
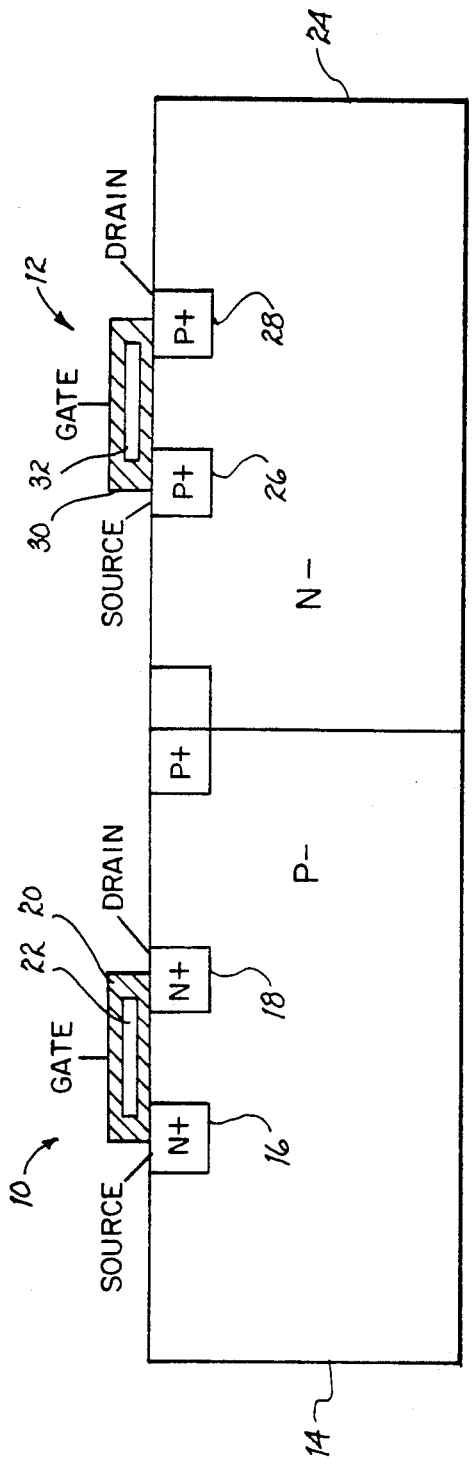
FIG. 1 is a cross sectional view of a prior art conventional CMOS transistor device.

Referring to the figures, FIG. 1 shows the prior art arrangement of a typical CMOS transistor device. The N-channel device 10 comprises a P− region 14, a N+ source junction 16, a N+ drain junction 18, an insulating layer 20, and a gate 22. The P-channel device 12 comprises a N− region 24, a P+ source junction 26, a P+ drain junction 28, an insulating layer 30, and a gate 32. Current flow between the source and drain junctions of devices 10 and 12 is controlled by a voltage applied to the conductors connected to the respective gates. The features and operational theory associated with the standard CMOS circuit shown in FIG. 1 is well known in the art.

Figure 2:
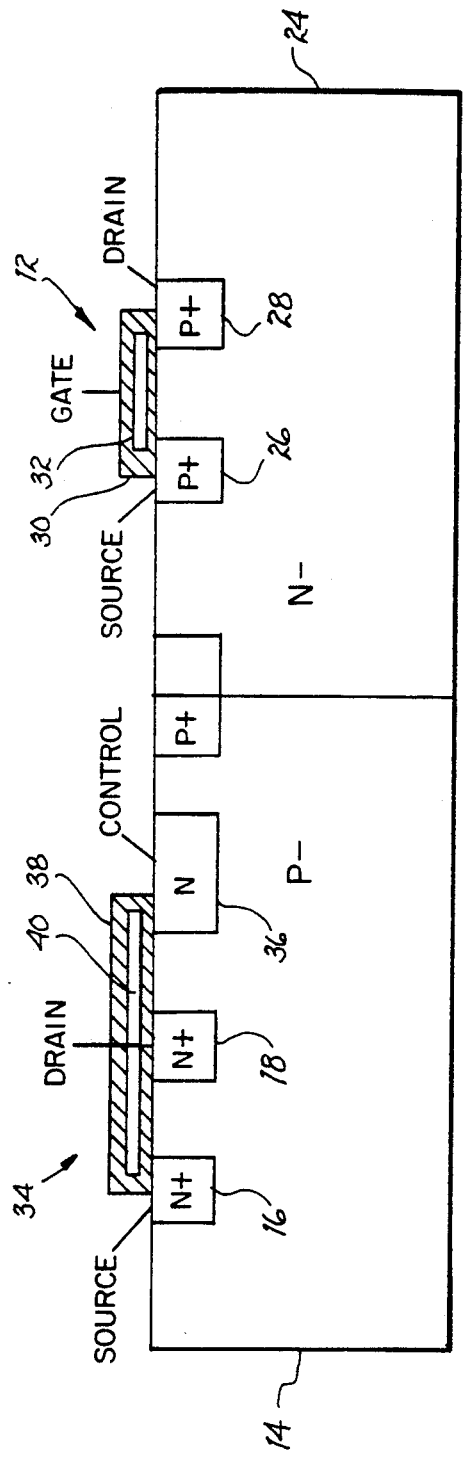
FIG. 2 is a cross sectional view of an N-channel MOS device of the present invention coupled to a conventional P-channel device thereby creating a CMOS-type configuration.

FIG. 2 illustrates how the device of the present invention can be used to replace the N-channel device 10 in the typical CMOS configuration shown in FIG. 1. An adjustable N-channel device 34 is provided which has a source junction 16 and a drain junction 18 identical to those respective junctions shown in FIG. 1. The insulating layer 38 and the gate 40 of device 34 are fabricated with the same process and materials used in FIG. 1. Notice that gate 40 is wider in the device 34 than in the device 10 in FIG. 1 to allow a conductor connected to control junction 36 to control the gate voltage of the device 34. In addition, the gate 40 is completely insulated from other conductors, with the only connection being capacitive coupling to the source junction 16, drain junction 18, and control junction 36.

The transistor channel characteristics of device 34 of FIG. 2 are determined by two factors: the charge level of insulated gate 40, and the voltage impressed on the control junction 36. The charge level of gate 40 is changed by injecting charge at the drain junction 18. Gate 40 and insulating layer 38 are constructed such that the charge on gate 40 remains at a constant level indefinitely, or until the user injects or removes charge again. In this manner the user can set the appropriate charge level on the gate 40 prior to using the device 34, and then control device 34 using the control junction 36. Needless to say, the charge level on the gate 40 could also be changed in-circuit to dynamically change the characteristics of the device 34 should the need arise.

The configuration shown in FIG. 2 has the conventional N-channel device 10 replaced by the device 34 of the present invention. Notice that the configuration of device 12 in FIG. 2 remains unaltered; only the N-channel device is adjustable. This configuration could be reversed, with a conventional N-channel device and an adjustable P-channel device. A configuration where both the N-channel and P-channel devices are simultaneously adjustable is shown in FIG. 3.

Figure 3:
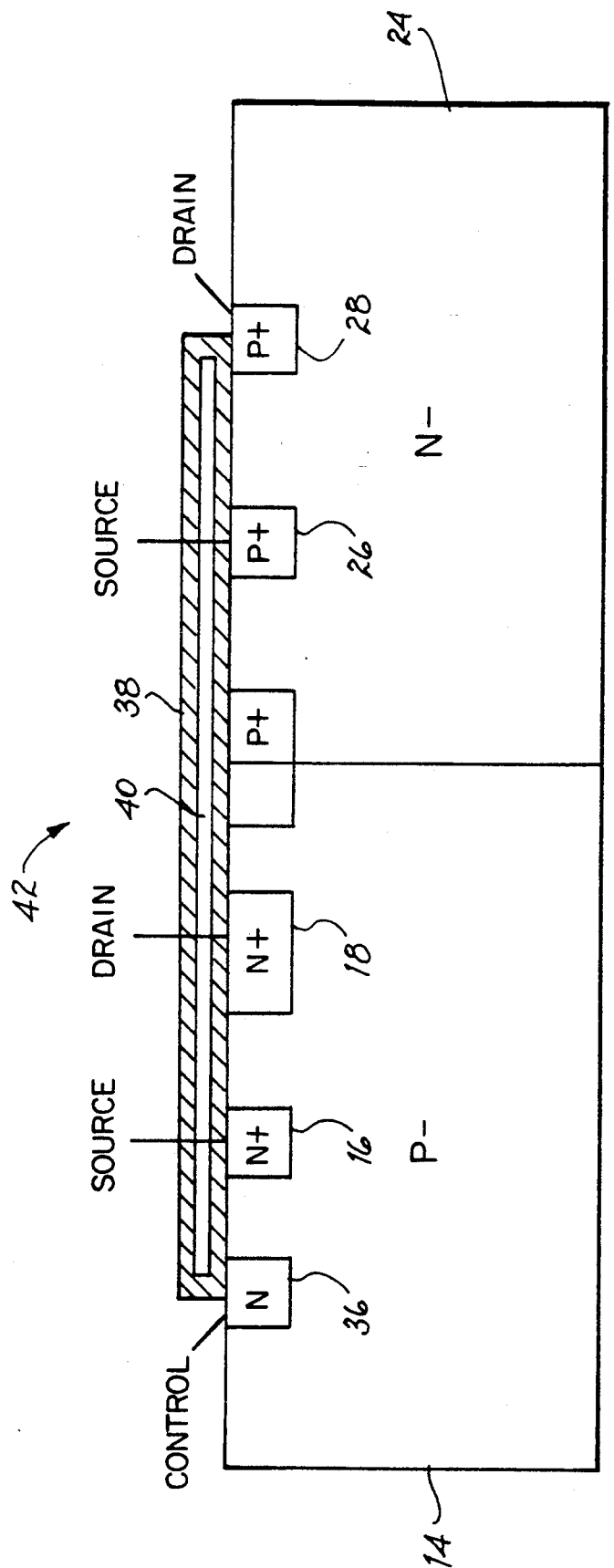
FIG. 3 is a cross sectional view of a CMOS device of the present invention.

The device 42 of FIG. 3 is similar to the device 34 of FIG. 2, but the gate 40 and insulating layer 38 extend all the way across to the P-channel source junction 26 and drain junction 28 as shown. In this manner the charge on gate 40 may be adjusted by the user by injecting or removing charge at drain junction 18 or drain junction 28. The voltage impressed on control junction 36 controls the transistor channel characteristics of both transistors within device 42 simultaneously.

While the invention has been described in its preferred embodiment, it is to be understood that the words which have been used are words of description rather than limitation, and that changes may be made within the purview of the appended claims without departing from the true scope and spirit of the invention in its broader aspects.

What is claimed is:

1. A CMOS integrated circuit comprising, in combination:
    a semiconductor substrate having a planar top surface;
    a first region of a first conductivity type located in said substrate and in contact with said planar top surface;
    second and third regions of a second conductivity type opposite said first conductivity type located in said first region in said substrate and in contract with said planar top surface, said second and said third regions of said second conductivity type forming the source and the drain, respectively, of a first MOS transistor;
    a separate fourth region of said second conductivity type located in said first region in said substrate and in contact with said planar top surface, said fourth region of said second conductivity type having a lower doping concentration than either of said second and third regions of said second conductivity type and forming a control junction;
    a fifth region of said second conductivity type located in said substrate and in contact with said planar top surface, said fifth region having a lower doping concentration than said fourth region of said second conductivity type;
    sixth and seventh regions of said first conductivity type located in said fifth region of said second conductivity type in said substrate and in contact with said planar top surface, said sixth and seventh regions of said first conductivity type forming the source and the drain respectively, of a second MOS transistor of complementary conductivity type to said first transistor;
    an insulating gate layer of substantially uniform thickness over each of said first, second, third, fourth, fifth, sixth and seventh regions of said first and second conductivity types in said substrate;
    conductive means connected to said fourth region of said second conductivity type for controlling the voltage on said control junction;
    conductive gate means over said insulating gate layer and spanning over said first, second, third, and fourth regions of said first and second conductivity types for controlling the threshold of said first MOS transistor by the combination of voltage on said control junction and charge injected at said drain of said first MOS transistor.

2. The CMOS integrated circuit according to claim 1, wherein said conductive gate means also spans over at least a portion of said fifth region of said first conductivity type and over at least a portion of said sixth and seventh regions of said first conductivity type for controlling transistor channel characteristics of both said first and second MOS transistors.

* * * * *

UNITED STATES PATENT AND TRADEMARK OFFICE
CERTIFICATE OF CORRECTION

PATENT NO. : 5,309,009
DATED : May 3, 1994
INVENTOR(S) : Robert L. Chao

It is certified that error appears in the above-indentified patent and that said Letters Patent is hereby corrected as shown below:

Column 4, line 6, change "contract" to --contact--.

Signed and Sealed this

Sixth Day of September, 1994

Attest:

BRUCE LEHMAN

*Attesting Officer*     *Commissioner of Patents and Trademarks*